United States Patent
Tan et al.

(10) Patent No.: US 10,916,579 B2
(45) Date of Patent: Feb. 9, 2021

(54) OPTOELECTRONIC DEVICE WITH LIGHT-EMITTING DIODES

(71) Applicant: Aledia, Grenoble (FR)

(72) Inventors: Wei Sin Tan, Meylan (FR); Philippe Gilet, Teche (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 16/474,017

(22) PCT Filed: Dec. 28, 2017

(86) PCT No.: PCT/EP2017/084781
§ 371 (c)(1),
(2) Date: Jun. 26, 2019

(87) PCT Pub. No.: WO2018/122358
PCT Pub. Date: Jul. 5, 2018

(65) Prior Publication Data
US 2019/0319066 A1    Oct. 17, 2019

(30) Foreign Application Priority Data
Dec. 29, 2016  (FR) ..................... 16 63507

(51) Int. Cl.
*H01L 27/15*    (2006.01)
*H01L 33/08*    (2010.01)
(Continued)

(52) U.S. Cl.
CPC ............ *H01L 27/156* (2013.01); *H01L 33/08* (2013.01); *H01L 33/24* (2013.01); *H01L 33/504* (2013.01);
(Continued)

(58) Field of Classification Search
CPC ....... H01L 27/156; H01L 33/08; H01L 33/24; H01L 33/503; H01L 33/505; H01L 33/56;
(Continued)

(56) References Cited

U.S. PATENT DOCUMENTS 6,506,342 B1 *   1/2003   Frankel ................ B01J 19/0046
                                                                365/151
7,541,623 B2 *   6/2009   Yi .......................... B82Y 10/00
                                                                257/183
(Continued)

FOREIGN PATENT DOCUMENTS

EP          2 242 120 A1      10/2010
WO     WO 2011/090863 A1      7/2011
(Continued)

OTHER PUBLICATIONS

International Search Report and Written Opinion for International Application No. PCT/EP2017/084781, dated Mar. 19, 2018.
(Continued)

*Primary Examiner* — Ida M Soward
(74) *Attorney, Agent, or Firm* — Wolf, Greenfield & Sacks, P.C.

(57) ABSTRACT

An optoelectronic device including light-emitting diodes (LED), each light-emitting diode including a semiconductor element corresponding to a nanowire, a microwire, and/or a nanometer- or micrometer-range pyramidal structure, and a shell at least partially covering the semiconductor element and adapted to emit a radiation and for each light-emitting diode, a photoluminescent coating including a single quantum well, multiple quantum wells or an heterostructure, covering at least part of the shell and in contact with the shell or with the semiconductor element and adapted to convert by optical pumping the radiation emitted by the shell into another radiation.

14 Claims, 7 Drawing Sheets

(51) Int. Cl.
*H01L 33/24* (2010.01)
*H01L 33/50* (2010.01)
*H01L 33/56* (2010.01)
*H01L 29/06* (2006.01)
*H01L 29/12* (2006.01)
*H01L 29/15* (2006.01)
*H01L 33/18* (2010.01)
*H01L 51/50* (2006.01)

(52) U.S. Cl.
CPC ............ *H01L 33/505* (2013.01); *H01L 33/56* (2013.01); *H01L 29/0676* (2013.01); *H01L 29/125* (2013.01); *H01L 29/15* (2013.01); *H01L 33/18* (2013.01); *H01L 51/502* (2013.01); *H01L 2933/005* (2013.01); *H01L 2933/0041* (2013.01)

(58) Field of Classification Search
CPC . H01L 51/502; H01L 29/0676; H01L 29/125; H01L 29/15; H01L 33/504
See application file for complete search history.

(56) References Cited

U.S. PATENT DOCUMENTS

| | | | | |
|---|---|---|---|---|
| 7,662,706 | B2* | 2/2010 | Samuelson | B01J 37/0238 |
| | | | | 117/87 |
| 7,910,915 | B2* | 3/2011 | Kamins | H01L 29/068 |
| | | | | 257/13 |
| 8,377,729 | B2* | 2/2013 | Kahen | B82Y 10/00 |
| | | | | 257/E21.462 |
| 8,525,954 | B2* | 9/2013 | Li | H01L 27/3209 |
| | | | | 349/74 |
| 8,565,281 | B2* | 10/2013 | Kambhampati | B82Y 20/00 |
| | | | | 372/69 |
| 9,042,420 | B2* | 5/2015 | Shur | H01L 21/02518 |
| | | | | 372/45.012 |
| 10,418,506 | B2* | 9/2019 | Dupont | H01L 31/16 |
| 2005/0161662 | A1* | 7/2005 | Majumdar | H01L 33/24 |
| | | | | 257/18 |
| 2010/0180950 | A1* | 7/2010 | Gao | H01L 21/228 |
| | | | | 136/265 |
| 2011/0163292 | A1* | 7/2011 | Wang | B82Y 20/00 |
| | | | | 257/13 |
| 2014/0264261 | A1* | 9/2014 | Mastro | H01L 33/24 |
| | | | | 257/13 |
| 2015/0325743 | A1* | 11/2015 | Mi | H01L 29/127 |
| | | | | 136/249 |
| 2018/0254382 | A1* | 9/2018 | Dupont | H01L 33/40 |

FOREIGN PATENT DOCUMENTS

| WO | WO 2015/044620 A1 | 4/2015 |
|---|---|---|
| WO | WO 2015/091754 A1 | 6/2015 |

OTHER PUBLICATIONS

Li et al., Time-resolved photoluminescence studies of InGaN/GaN multi-quantum-wells blue and green light-emitting diodes at room temperature. Optik. Feb. 2016;127(4):1809-13.
International Preliminary Report on Patentability for International Application No. PCT/EP2017/084781, dated Jul. 11, 2019.

\* cited by examiner

OPTOELECTRONIC DEVICE WITH LIGHT-EMITTING DIODES

This application is a national stage filing under 35 U.S.C. § 371 of International Patent Application Serial No. PCT/EP2017/084781, filed Dec. 28, 2017, which claims priority to French patent application FR16/63507, filed Dec. 29, 2016. The entire contents of these applications are incorporated herein by reference in their entireties.

BACKGROUND

The present disclosure relates to an optoelectronic device, particularly a display screen or an image projection device, comprising light-emitting diodes formed by three-dimensional elements, particularly semiconductor microwires or nanowires.

Discussion of the Related Art

A pixel of an image corresponds to the unit element of the image displayed by the optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superposing of the radiations emitted by the three display sub-pixels provides the observer with the color sensation corresponding to the pixel of the displayed image. In this case, the assembly formed by the three sub-display pixels used to display a pixel of an image is called display pixel of the optoelectronic device.

Optoelectronic devices comprising light-emitting diodes are devices capable of converting an electric signal into an electromagnetic radiation, and particularly devices dedicated to emitting an electromagnetic radiation, particularly light. Examples of three-dimensional elements capable of forming light-emitting diodes are microwires or nanowires comprising a semiconductor material based on a compound mainly comprising at least one group-III element and one group-V element (for example, gallium nitride GaN), called III-V compound hereafter, or mainly comprising at least one group-II element and one group-VI element (for example, zinc oxide ZnO), called II-VI compound hereafter.

However, known light-emitting diodes comprising three-dimensional elements emitting a red light show poor internal quantum efficiency.

Optoelectronic devices may comprise a layer comprising blocks of photoluminescent materials facing at least some of the light-emitting diodes. Each photoluminescent block is adapted to convert the radiation emitted by the associated light-emitting diode into a desired radiation. Known photoluminescent blocks comprise micrometer-range photoluminescent particles or quantum dots. However, known materials used to form micrometer-range photoluminescent particles show poor internal quantum efficiency. Moreover, quantum dots show reduced lifetime.

SUMMARY

An object of an embodiment aims at overcoming all or part of the disadvantages of the previously-described optoelectronic devices comprising light-emitting diodes.

Another object of an embodiment is that the internal quantum efficiency of the photoluminescent blocks is increased.

Another object of an embodiment is that the lifetime of the photoluminescent blocks is increased.

Another object of an embodiment is that the light-emitting diodes comprise three-dimensional elements, particularly semiconductor microwires or nanowires.

Another object of an embodiment is that all the light-emitting diodes of the optoelectronic device show high internal quantum efficiency.

Another object of an embodiment is that the photoluminescent blocks of the optoelectronic device show high internal quantum efficiency.

Another object of an embodiment is for optoelectronic devices comprising light-emitting diodes to be capable of being manufactured at an industrial scale and at a low cost.

Thus, an embodiment provides an optoelectronic device comprising:

light-emitting diodes, each light-emitting diode comprising a semiconductor element corresponding to a nanowire, a microwire, and/or a nanometer- or micrometer-range pyramidal structure, and a shell at least partially covering the semiconductor element and adapted to emit a radiation; and for each light-emitting diode, a photoluminescent coating comprising a single quantum well, multiple quantum wells or an heterostructure, covering at least part of the shell and in contact with the shell or with the semiconductor element and adapted to convert by optical pumping the radiation emitted by the shell into another radiation.

According to an embodiment, the light-emitting diodes are adapted to emit a first radiation at a first wavelength and the photoluminescent coatings comprise first photoluminescent coatings adapted to convert by optical pumping the first radiation into a second radiation at a second wavelength, second photoluminescent coatings adapted to convert by optical pumping the first radiation into a third radiation at a third wavelength and third photoluminescent coatings adapted to convert by optical pumping the first radiation into a fourth radiation at a fourth wavelength.

According to an embodiment, each semiconductor element comprises lateral sides and a top face, and the photoluminescent coatings and the shells cover the lateral sides and top faces of the semiconductor elements.

According to an embodiment, each semiconductor element comprises lateral sides and a top face, the shells cover the lateral sides of the semiconductor elements and do not cover the top faces of the semiconductor elements, and the photoluminescent coatings cover the top faces of the semiconductor elements and do not cover the lateral sides of the semiconductor elements.

According to an embodiment, the optoelectronic device further comprises, for each light-emitting diode, an electrically conductive layer in contact with the shell.

According to an embodiment, for each light-emitting diode, the conductive layer is covered by a reflective layer.

According to an embodiment, the optoelectronic device further comprises walls resting on the substrate, at least partially made of a reflecting material at least for the second, third and fourth radiations and surrounding the light-emitting diodes.

According to an embodiment, the optoelectronic device further comprises a filter covering the photoluminescent coatings and adapted to block the first radiation and to give way to the second, third and fourth radiations.

According to an embodiment, the first wavelength is in the range from 360 nm to 430 nm, the second wavelength is in the range from 440 nm to 490 nm, the third wavelength is in the range from 510 nm to 570 nm, and the fourth wavelength is in a range from 610 nm to 720 nm.

According to an embodiment, the photoluminescent coatings further comprise fourth photoluminescent coatings adapted to convert by optical pumping the first radiation into a fifth radiation at a fifth wavelength.

According to an embodiment, the fifth wavelength is in the range from 570 nm to 600 nm.

Another embodiment provides a method of manufacturing the previously disclosed optoelectronic device, comprising the successive steps of:

a) forming the light-emitting diodes; and
b) forming the photoluminescent coatings.

According to an embodiment, the method further comprises, before step b), the formation of an electrically conductive layer covering the shells, and, before step b), the withdrawal of the conductive layers and the shells at the tops of the semiconductor elements, and the formation of the photoluminescent coatings at the tops of the semiconductor elements.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing a light-emitting diode of an optoelectronic device are well known and will not be described.

The present description relates to optoelectronic devices comprising light-emitting diodes formed from three-dimensional elements, for example, microwires or nanowires. In the following description, embodiments are described for light-emitting diodes formed from microwires or nanowires. However, these embodiments may be implemented for three-dimensional elements other than microwires or nanowires, for example, pyramid-shaped three-dimensional elements.

In the following description, unless otherwise indicated, terms "substantially", "approximately", and "in the order of" mean "to within 10%". Further, "compound mainly made of a material" or "compound based on a material" means that a compound comprises a proportion greater than or equal to 95% of said material, this proportion being preferably greater than 99%. Moreover, "active area" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

Term "microwire" or "nanowire" designates a three-dimensional structure of elongated shape along a preferred direction, having at least two dimensions, called minor dimensions, in the range from 10 nm to 10 µm, preferably from 100 nm to 2 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm, most preferably in the range from 1 µm to 15 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire or of a layer deposited on this wire designates a quantity associated with the surface area of the targeted structure in this cross-section, corresponding, for example, to the diameter of the disk having the same surface area as the wire cross-section.

The cross-section of each wire may be substantially identical along the axis of the wire or may vary along the axis of the wire. In an example, the wires may have a conical or a frustoconical shape.

In the following description, term pyramid or truncated pyramid designates a three-dimensional structure, part of which has a pyramidal or elongated conical shape. The pyramidal structure may be truncated, that is, the tip of the cone is absent and replaced by a flat area. The base of the pyramid is inscribed within a polygon having a side dimension from 100 nm to 10 µm, preferably from 1 µm to 3 µm. The polygon forming the base of the pyramid may be a hexagon. The height of the pyramid between the base of the pyramid and the apex or the top plateau varies from 100 nm to 20 µm, preferably from 1 µm to 10 µm.

Figure 1:
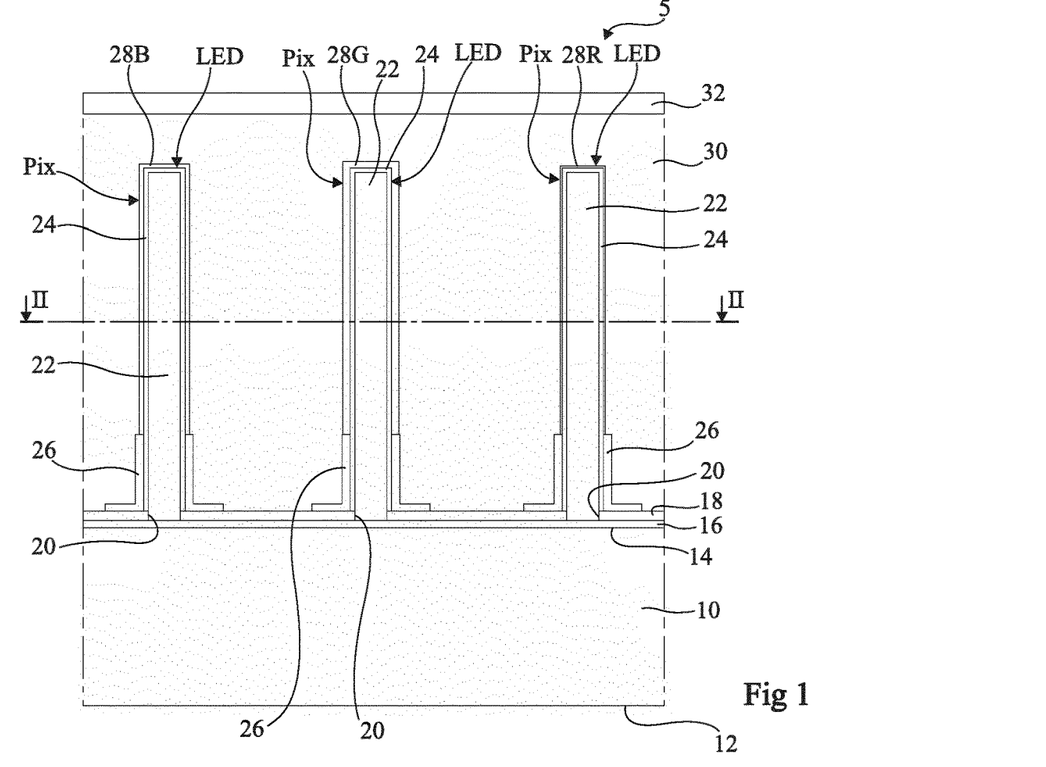
FIGS. 1 and 2 are partial simplified cross-section views in orthogonal planes of an embodiment of an optoelectronic device comprising light-emitting diodes.
Figure 2:
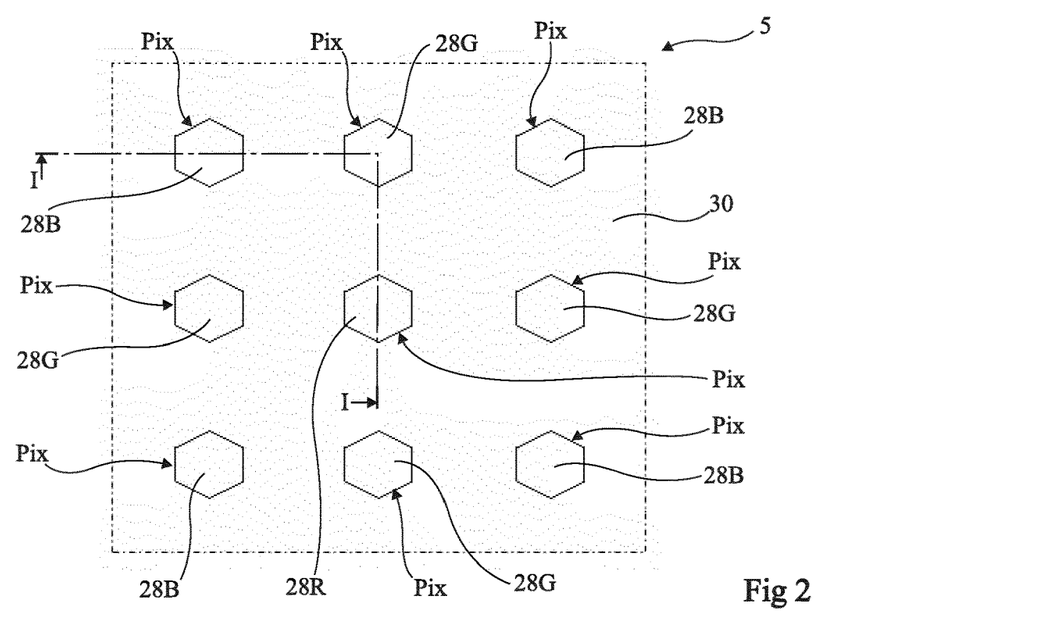

FIGS. 1 and 2 show an embodiment of an optoelectronic device 5 comprising light-emitting diodes, for example corresponding to a display screen or to an image projection device.

FIG. 1 shows a structure comprising, from bottom to top:

a semiconductor substrate 10 comprising a lower surface 12 and an upper surface 14, upper surface 14 being preferably planar at least at the level of the light-emitting diodes;

a seed layer 16 made of a conductive material favoring the wire growth and arranged on surface 14;

an insulating layer 18 covering seed layer 16 and comprising openings 20 exposing portions of seed layer 16;

wires 22 (three wires being shown on FIG. 1), each wire 22 being in contact with seed layer 16 through one of openings 20;

for each wire 22, a shell 24 comprising a stack of semiconductor layers covering the wire 22;

for each wire 22, an electrically conductive layer 26 extending on the lateral sides of a lower portion of shell 24 and extending on insulating layer 18;

for each wire 22, a photoluminescent coating 28R, 28G, 28B comprising a stack of semiconductor layers covering an upper portion of shell 24;

an encapsulation layer 30 covering the entire structure; and a filter 32 resting on encapsulation layer 30.

Optoelectronic device 5 comprises an electrode, not shown, in contact with substrate 10 on surface 12 or surface 14.

The assembly formed by each wire 22 and the associated shell 24 forms a light-emitting diode LED. Each shell 24 particularly comprises an active layer which is the layer from which most of the electromagnetic radiation supplied by light-emitting diode LED is emitted. The assembly may comprise from a few light-emitting diodes LED to some thousand light-emitting diodes.

In an embodiment, all light-emitting diodes LED emit an electromagnetic radiation at a first wavelength. In an embodiment, optoelectronic device 5 comprises at least three types of photoluminescent coatings 28R, 28G, 28B. For each pixel of the image to be displayed, optoelectronic device 5 comprises subpixels with photoluminescent coatings 28R, 28G, 28B of the three types. Photoluminescent coatings 28B of the first type are adapted to convert the radiation at the first wavelength into a radiation at a second wavelength by optical pumping. Photoluminescent coatings 28G of the second type are adapted to convert the radiation at the first wavelength into a radiation at a third wavelength by optical pumping. Photoluminescent coatings 28R of the third type are adapted to convert the radiation at the first wavelength into a radiation at a fourth wavelength by optical pumping. In an embodiment, first, second, third and fourth wavelengths are different. In an embodiment, the first wavelength correspond to ultraviolet radiation, and is in the range from 360 nm to 430 nm. In an embodiment, the second wavelength corresponds to blue light and is in the range from 440 nm to 490 nm. In an embodiment, the third wavelength corresponds to green light and is in the range from 510 nm to 570 nm. In an embodiment, the fourth wavelength corresponds to red light and is in a range from 610 nm to 720 nm.

A subpixel Pix is formed by one light-emitting diode LED and the associated photoluminescent coating 28R, 28G, 28B. For each pixel of the image to be displayed, optoelectronic device 5 comprises subpixels with photoluminescent coatings of the three types. In an example, nine subpixels Pix, arranged like a Bayer filter mosaic, are shown in FIG. 2.

In an embodiment, optoelectronic device 5 comprises photoluminescent coatings of a fourth type, not shown. Photoluminescent coatings of the fourth type are adapted to convert the radiation at the first wavelength into a radiation at a fifth wavelength by optical pumping. In an embodiment, fifth wavelength corresponds to yellow light and is in a range from 570 nm to 600 nm. In an embodiment, first, second, third, fourth and fifth wavelengths are different. For each pixel of the image to be displayed, optoelectronic device 5 comprises subpixels with photoluminescent coatings of the four types.

Substrate 10 may correspond to a monoblock structure or correspond to a layer, on which the wires are grown, covering a support made of another material. Substrate 10 is preferably a semiconductor substrate, for example, a substrate made of silicon, of germanium, of silicon carbide, of sapphire, of a III-V compound, such as GaN or GaAs, or a ZnO substrate. Preferably, substrate 10 is a single-crystal silicon substrate. Preferably, it is a semiconductor substrate compatible with the manufacturing methods implemented in microelectronics. Substrate 10 may correspond to a multi-layer structure of silicon on insulator type, also called SOI. When substrate 10 comprises a layer covering a support made of another material, the layer may be made of a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Support, covered by said layer, may be made of silicon, of germanium, of silicon carbide, of sapphire, of a III-V compound, such as GaN or GaAs, or a ZnO substrate.

Substrate 10 may be heavily doped, lightly-doped or non-doped. In the case where the substrate is heavily-doped, semiconductor substrate 10 may be doped to lower the electric resistivity down to a resistivity close to that of metals, preferably smaller than a few mohm·cm. Substrate 10 is, for example, a heavily-doped substrate 10 with a dopant concentration in the range from $5*10^{16}$ atoms/cm$^3$ to $2*10^{20}$ atoms/cm$^3$. In the case where the substrate is lightly-doped, for example, with a dopant concentration smaller than or equal to $5*10^{16}$ atoms/cm3, preferably substantially equal to $10^{15}$ atoms/cm3, a doped region of the first conductivity type or of a second conductivity type, opposite to the first type, more heavily-doped than the substrate may be provided, which extends in substrate 10 from surface 12 under seed layer 16. In the case of a silicon substrate 10, examples of P-type dopants are boron (B) or indium (In) and examples of N-type dopants are phosphorus (P), arsenic (As), or antimony (Sb). Surface 14 of silicon substrate 10 may be a (100) surface or a (111) surface.

Seed layer 16 is made of a material favoring the growth of wires 22. As an example, the material forming seed layer 16 may be a nitride, a carbide, or a boride of a transition metal from column IV, V, or VI of the periodic table of elements or a combination of these compounds. As an example, seed layer 16 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum nitride and carbide (TaCN), of magnesium nitride in Mg$_x$N$_y$ form, where x is approximately equal to 3 and y is approximately equal to 2, for example, magnesium nitride according to form Mg$_3$N$_2$ or magnesium gallium nitride (MgGaN), of tungsten (W), of tungsten nitride (WN), or of a combination thereof. Seed layer 16 may be doped with the same conductivity type as substrate 10. Seed layer 16 may have a monolayer structure or may correspond to a stack of two layers or of more than two layers. Seed layer 16 may be replaced with seed pads, also called seed islands, each wire 22 resting on one of the seed pads.

Insulating layer 18 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of aluminum oxide ($Al_2O_3$), of hafnium oxide ($HfO_2$), or of diamond.

Wires 22 are at least partly made of at least one semiconductor material. The semiconductor material may be silicon, germanium, silicon carbide, a III-V compound, a II-VI compound, or a combination of at least two of these compounds.

Wires 22 may be at least partly made of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 22 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Wires 22 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn). Concentration of dopants may not be homogeneous in wires 22. In an example, the lower part of each wire 22 may be more heavily doped that the upper part of the wire 22.

The axes of two adjacent wires 22 may be distant by from 0.5 µm to 10 µm and preferably from 1.5 µm to 4 µm.

Conductive layer 26 is made of a conductive material, for example a metal such as aluminum, silver, copper, or zinc. Conductive layer 26 may be made of conductive material, transparent at the first, second, third, fourth and possibly fifth wavelengths, such as graphene or a transparent conductive oxide (TCO), for example, indium tin oxide (ITO), aluminum zinc oxide (AZO) or gallium zinc oxide (GZO). As an example, conductive layer 26 has a thickness in the range from 5 nm to 5 µm, preferably from 500 nm to 5 µm.

Encapsulation layer 30 is made of an insulating material at least partially transparent to radiations at the first, second, third, fourth and fifth wavelengths, for example a silicone or an oxide. The maximum thickness of encapsulation layer 30 is in the range from 250 nm to 50 µm so that encapsulation layer 30 totally covers the tops of light-emitting diodes LED.

Filter 32 is adapted to block the radiation emitted from light-emitting diodes LED and which has not been converted by photoluminescent coatings 28R, 28G, 28B. Filter 32 is adapted to give way to the radiations emitted by photoluminescent coatings 28R, 28G, 28B. Filter 32 may have a multilayer structure. In an embodiment, for light-emitting diodes LED emitting radiation at the first wavelength in the range from 360 nm to 430 nm, filter 32 may be made of band pass filter characteristics, thus allowing only radiation of wavelengths 440 nm to 720 nm to pass through.

As a variation, a mirror conductive layer, not shown, covering conductive layer 26 and insulating layer 18 between wires 22 but without extending on wires 22, may be provided. The mirror conductive layer may correspond to a metal layer, for example, made of aluminum, of silver, of copper, or of zinc.

In operation, voltages are applied between conductive layers 26 and substrate 10, so that, for each subpixel Pix, the active area of light-emitting diode LED emits light with an intensity that depends on the voltage applied between conductive layer 26 associated with subpixel Pix and substrate 10. Photoluminescent coating 28R, 28G, 28B converts at least part of the radiation emitted by associated light-emitting diode LED into the desired radiation by optical pumping. In an embodiment, all light-emitting diodes LED emit at the same first wavelength. Filter 32, which is adapted to block the radiation emitted from light-emitting diodes LED that has not been converted by photoluminescent coatings 28R, 28G, 28B, advantageously covers all optoelectronic device 5.

In the embodiment shown in FIGS. 1 and 2, substrate 10 is substantially at the same potential and different potentials may be applied to conductive layers 26. Alternatively, conductive layers 26 are connected to each other and electrically insulating trenches are provided in substrate 10 to delimit portions of substrate 10, each portion of substrate 10 being electrically linked to at least one wire 22, preferably only one wire 22. In the case where conductive layers 26 are connected to each other and where insulated portions of substrate 10 are formed, connected conductive layers 26 may be at the same potential and different potentials may be applied to the portions of substrate 10.

Figure 3:
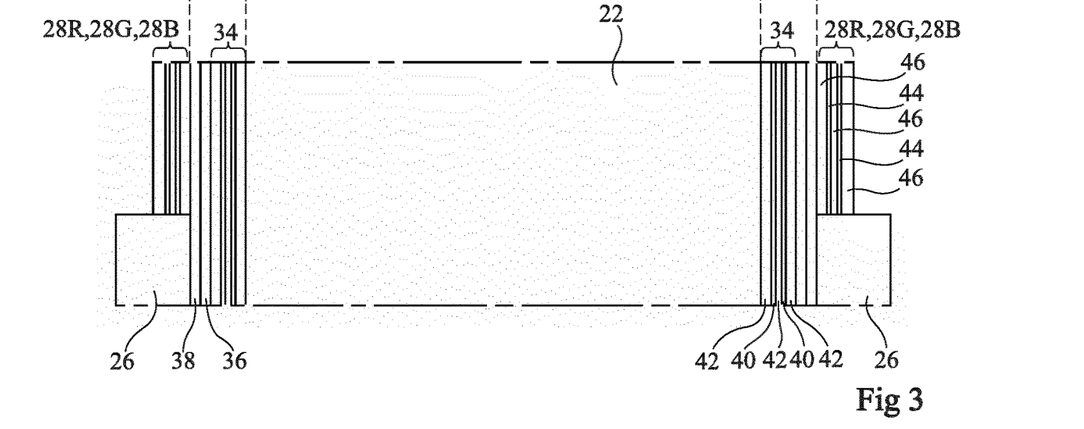
FIG. 3 is a detail view of FIG. 1 of an embodiment of light-emitting diodes comprising microwires or nanowires.

FIG. 3 is a detail view of FIG. 1 of an embodiment of shell 24 and of photoluminescent coating 28R, 28G or 28B.

Shell 24 may comprise a stack of a plurality of layers especially comprising:

an active layer 34 covering the upper portion of wire 22;

an intermediate layer 36 having a conductivity type opposite to the wire 22 covering the active layer 34; and a bonding layer 38 covering intermediate layer 36, a lower part of bonding layer 38 being covered by conductive layer 26 and an upper part of bonding layer 38 being covered by photoluminescent coating 28R, 28G or 28B.

Active layer 34 is the layer having most of the radiation supplied by light-emitting diode LED emitted therefrom. According to an example, active layer 34 may comprise confinement means. Active area 34 may comprise a single quantum well. It may then comprise a semiconductor material different from the semiconductor material forming wire 22 and intermediate layer 36 and having a bandgap smaller than that of intermediate layer 36. Active area 34 may comprise multiple quantum wells. It then comprises a stack of semiconductor layers forming an alternation of quantum wells 40 and of barrier layers 42. Preferably the layers of active area 34 are linked to wire 22 by an epitaxial relationship.

In an embodiment, light-emitting diodes LED emitting radiation at the first ultraviolet wavelength in the range from 360 nm to 430 nm may be formed of an alternation of GaN and InGaN layers having respective thicknesses from 3 nm to 20 nm (for example, 6 nm) and from 1 nm to 30 nm (for example, 2.5 nm), InGaN layers having a proportion of 0% to 15% of In.

Intermediate layer 36, for example, P-type doped, may correspond to a semiconductor layer or to a stack of semiconductor layers and enables to form a P—N or P—I—N junction, active layer 34 being between intermediate P-type layer 36 and N-type wire 22 of the P—N or P—I—N junction.

Bonding layer 38 may correspond to a semiconductor layer or to a stack of semiconductor layers and enables to form an ohmic contact between intermediate layer 36 and conductive layer 26. As an example, bonding layer 38 may be very heavily doped with the type opposite to the lower portion of wire 22, to degenerate the semiconductor layers, for example, P-type doped with a concentration greater than or equal to $10^{19}$ atoms/cm$^3$.

The stack of semiconductor layers forming shell 24 may comprise an electron barrier layer formed of a ternary alloy, for example, aluminum gallium nitride (AlGaN), aluminium indium gallium nitride (AlInGaN) or aluminum indium nitride (AlInN) in contact with active layer 34 and intermediate layer 36, to ensure a good distribution of electric carriers in active layer 34.

Photoluminescent coating 28R, 28G and 28B is formed by a stack of semiconductor layers. Photoluminescent coating 28R, 28G and 28B may comprise confinement means. Photoluminescent coating 28R, 28G and 28B may comprise a single quantum well, multiple quantum wells or double heterostructure. It may then comprise an active semiconductor layer in sandwich between first and second semiconductor layers. Active semiconductor layer is made of a semiconductor material different from the semiconductor material forming first and second layers and having a bandgap smaller than that of first and second layers. As it is shown in FIG. 3, photoluminescent coating 28R, 28G and 28B may comprise multiple quantum wells. It then comprises a stack of semiconductor layers forming an alternation of quantum wells 44 and of barrier layers 46. The materials of the layers of photoluminescent coating 28R, 28G and 28B depend on the desired wavelength of the radiation emitted by photoluminescent coating 28R, 28G and 28B and the wavelength of the radiation received by photoluminescent coating 28R, 28G and 28B. Photoluminescent coatings with an internal quantum efficiency higher than 50% may be obtained. Moreover, photoluminescent coatings 28R, 28G and 28B with a long lifespan may be obtained.

An intermediate layer, not shown, may be provided between shell 24 and photoluminescent coating 28R, 28G and 28B, for example made of the same material as wire 22 with no dopants and having a thickness in the range from 1 nm to 5 µm, to prevent leakage of current.

In an embodiment, for light-emitting diodes LED emitting radiation at the first wavelength of 360 nm to 430 nm photoluminescent coatings 28B emitting a radiation at the second wavelength of 450 nm may be formed of an alternation of GaN and InGaN layers having respective thicknesses from 3 nm to 20 nm (for example, 6 nm) and from 1 nm to 30 nm (for example, 2.5 nm), InGaN layers having a proportion of 17%±5% of In.

In an embodiment, for light-emitting diodes LED emitting radiation at the first wavelength of 360 nm to 430 nm, photoluminescent coatings 28G emitting a radiation at the third wavelength of 530 nm may be formed of an alternation of GaN and InGaN layers having respective thicknesses from 3 nm to 20 nm (for example, 6 nm) and from 1 nm to 30 nm (for example, 2.5 nm), InGaN layers having a proportion of 28%±5% of In.

In an embodiment, for light-emitting diodes LED emitting radiation at the first wavelength of 360 nm to 430 nm, photoluminescent structures 28R emitting a radiation at the third wavelength of 630 nm may be formed of an alternation of GaN and InGaN layers having respective thicknesses from 3 nm to 20 nm (for example, 6 nm) and from 1 nm to 30 nm (for example, 2.5 nm), InGaN layers having a proportion of 45%±10% of In.

In an embodiment, for light-emitting diodes LED emitting radiation at the first wavelength of 360 nm to 430 nm, photoluminescent coatings emitting a radiation at the fourth wavelength of 580 nm may be formed of an alternation of GaN and InGaN layers having respective thicknesses from 3 nm to 20 nm (for example, 6 nm) and from 1 nm to 30 nm (for example, 2.5 nm), InGaN layers having a proportion of 35%±5% of In.

In the embodiment disclosed in FIGS. 1 and 2, for each light-emitting diode LED, conductive layer 26 covers the lower part of shell 24 and photoluminescent coating 28R, 28G, 28B covers the upper part of shell 24. Therefore, conductive layer 26 may block the radiation emitted from light-emitting diode LED. Alternatively, conductive layer 26 may have a fishnet-like pattern and extends over entire shell 24, photoluminescent coating 28R, 28G, 28B extending over shell 24 in the holes of conductive layer 26 and extending over conductive layer 26. This can be formed via self-assembled masking techniques such as annealing a thin Ni layer to form self-assembled mask or using TiO$_2$ or SiO$_2$ nanospheres. In another embodiment, conductive layer 26 is made of a material transparent to the radiation emitted by the light-emitting diode LED and conductive layer 26 covers entire shell 24, photoluminescent coating 28R, 28G, 28B covering conductive layer 26.

Figure 4:
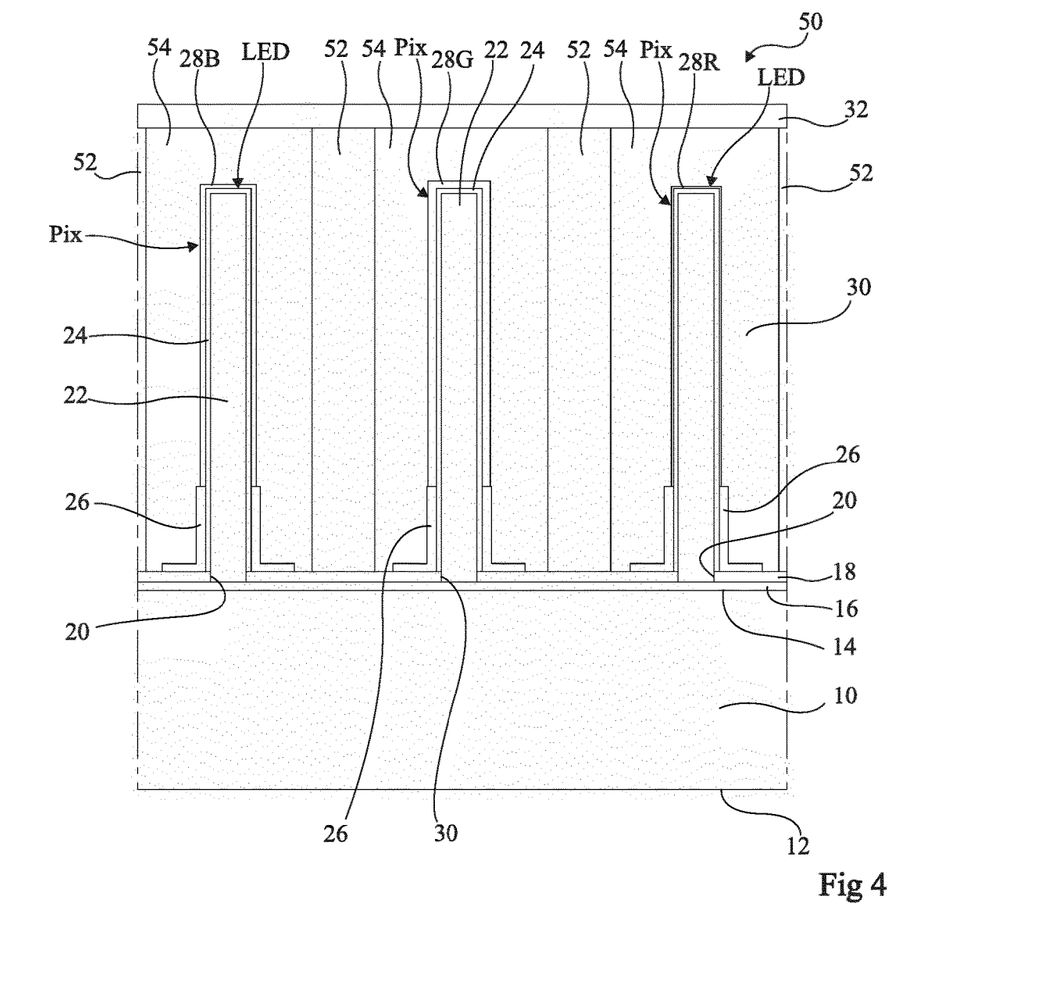
FIGS. 4 and 5 are partial simplified cross-section views in orthogonal planes of another embodiment of an optoelectronic device comprising light-emitting diodes.
Figure 5:
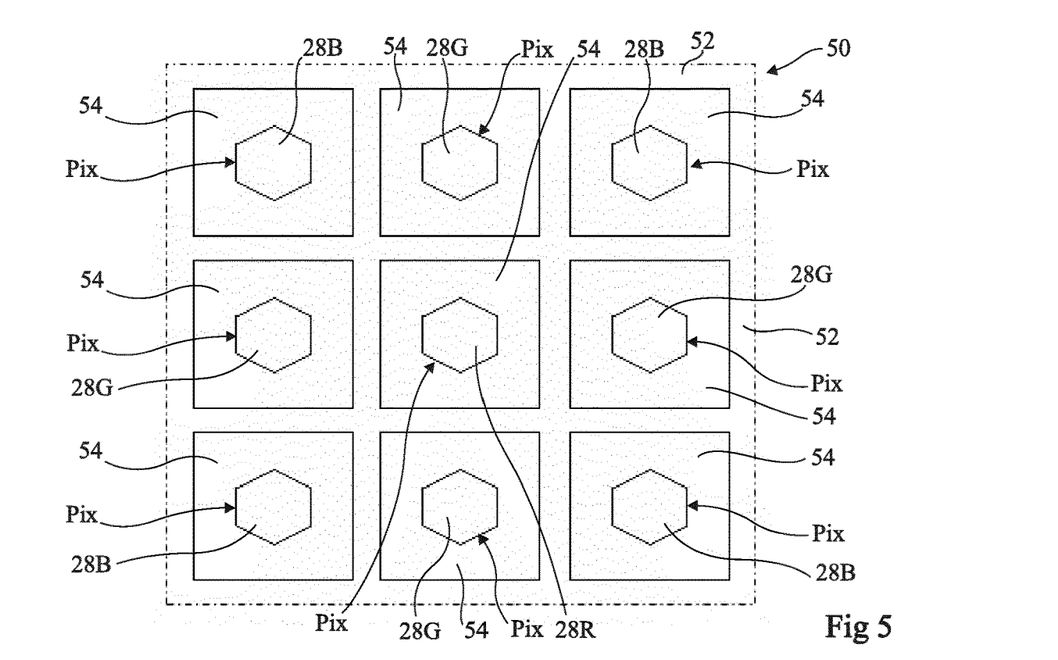

FIGS. 4 and 5 are partial simplified cross-section views in orthogonal planes of another embodiment of an optoelectronic device 50 comprising light-emitting diodes. Optoelectronic device 50 comprises the same elements as optoelectronic device 5 shown in FIG. 1 and further comprises walls 52 extending in encapsulation layer 30 from insulating layer 18. Walls 52 delimit portions 54 in encapsulation layer 30. In an embodiment, each portion 54 contains at least one light-emitting diode LED, preferably only one light-emitting diode LED. According to an embodiment, walls 52 form a grid and portions 54 are arranged in rows and columns. Portions 54 have a square shape in FIG. 5. However, the shape of portions 54 may be different.

Walls 52 reduce crosstalk between adjacent subpixels Pix. According to an embodiment, walls 52 may be made of a reflecting material or covered by a reflecting coating for the wavelengths of the radiations emitted by photoluminescent coatings 28R, 28G, 28B. Walls 52 may be made of a conductive material, for example a metal such as aluminum, silver, silicon, or zinc. The height of walls 52, measured in a direction orthogonal to surface 14, is in the range from 1 µm to 200 µm, preferably from 5 µm to 30 µm. The thickness of walls 52, measured in a direction parallel to surface 14, is in the range from 100 nm to 50 µm, preferably from 1 µm to 10 µm. In the view of FIG. 5, the area of each portion 54 corresponds to the area of a square having a side ranging from 1 µm to 100 µm, preferably from 3 µm to 15 µm.

Figure 6:
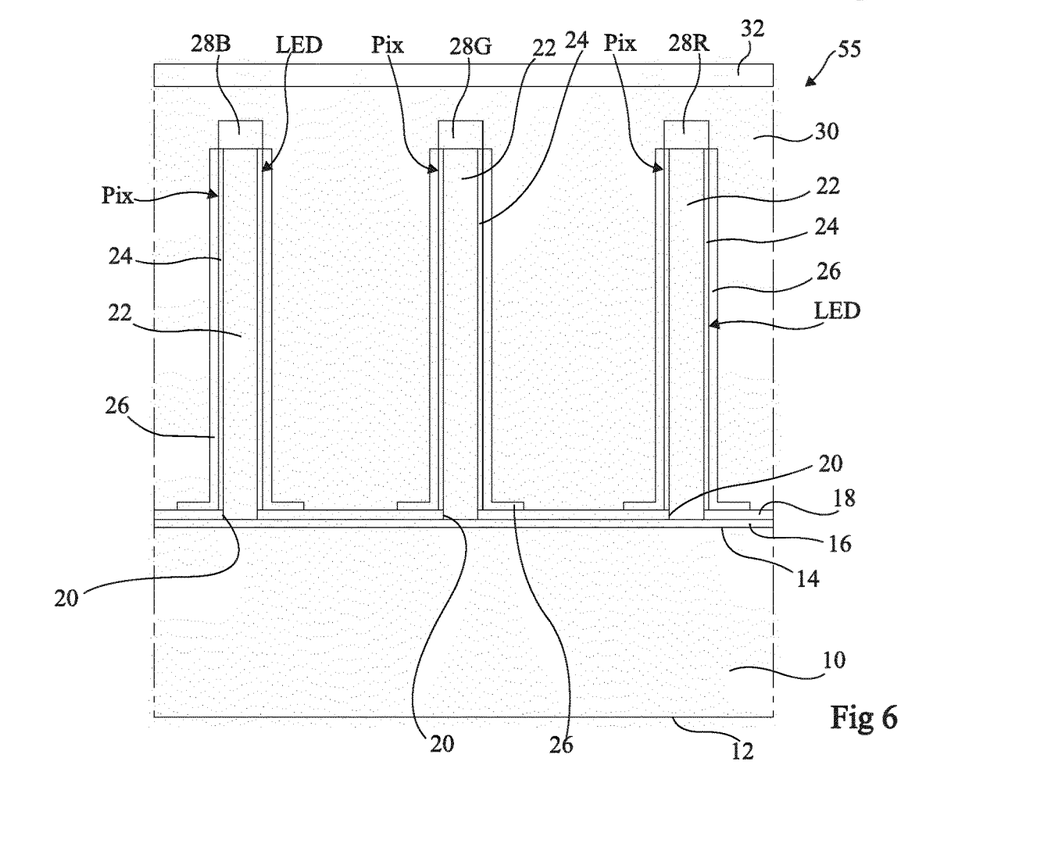
FIGS. 6 and 7 are partial simplified cross-section views of other embodiments of an optoelectronic device comprising light-emitting diodes.

FIG. 6 is a partial simplified cross-section view of another embodiment of an optoelectronic device 55 comprising light-emitting diodes. Optoelectronic device 55 comprises the same elements as optoelectronic device 5 shown in FIG. 1 with the difference that, for each light-emitting diode LED, shell 24 is not present on the top face of wire 22, in that photoluminescent coating 28R, 28G, 28B covers only the upper face of wire 22 and in that conductive layer 26 covers totally the lateral sides of shell 24 from the bottom to the top of shell 24. Photoluminescent coating 28R, 28G, 28B may correspond to a stack of semiconductor layers, the composition of the stack being for example the same as previously disclosed, in particular in FIG. 3, with the difference that the layers of the photoluminescent coatings 28R, 28G, 28B extend only over the upper face of wire 22, substantially orthogonally to the axis of wire 22, the stacking direction being along the axis of wire 22.

An intermediate layer, not shown, may be provided between shell 24 and photoluminescent coating 28R, 28G, 28B, for example made of the same material as wire 22 with no intentional dopants and having a thickness in the range from 1 nm to 5 µm, to prevent leakage of current. The thickness of conductive layer 26 is advantageously in the range from 500 nm to 5 µm to act as a guide wave with respect to the radiation emitted by the light-emitting diode LED.

Figure 7:
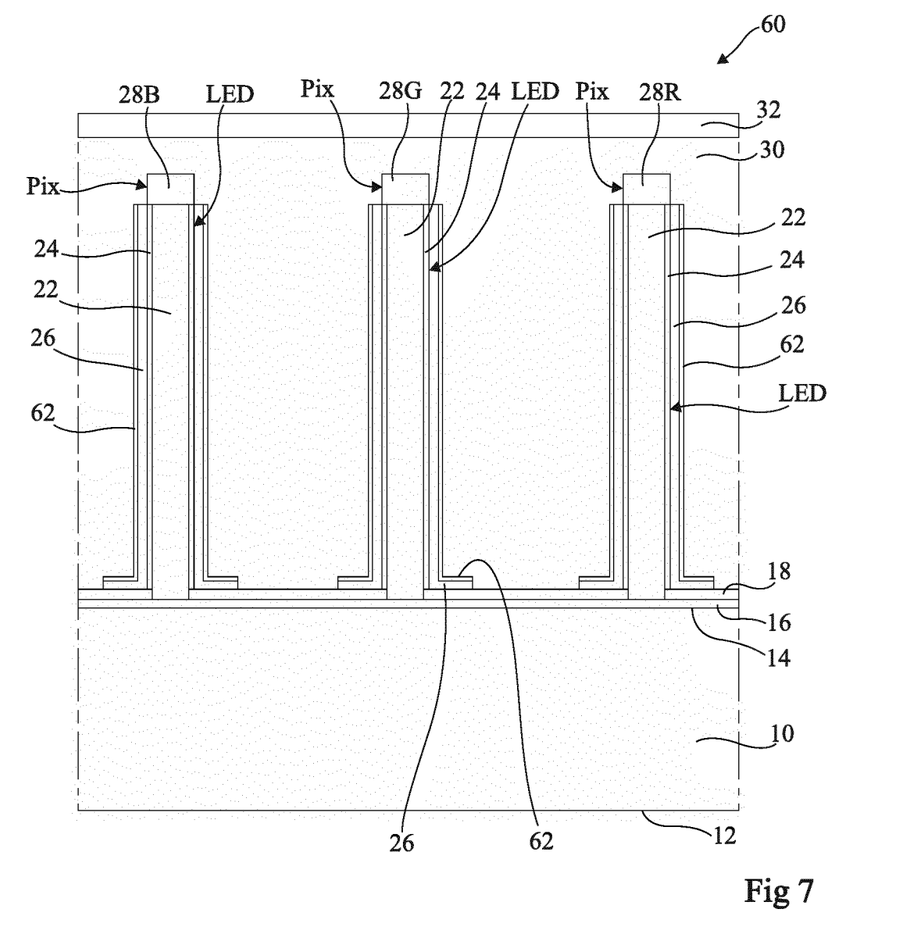

FIG. 7 is a partial simplified cross-section view of another embodiment of an optoelectronic device 60 comprising light-emitting diodes. Optoelectronic device 60 comprises the same elements as optoelectronic device 55 shown in FIG. 6 and further comprises, for each light-emitting diode LED, a coating 62 covering conductive layer 26 that is reflective for the wavelengths of the radiations emitted by photoluminescent coatings 28R, 28G, 28B. Coatings 62 may be made of a conductive material, for example a metal such as aluminum, silver, copper, or zinc. The thickness of coatings 62 is in the range from 100 nm to 50 µm, preferably from 1 µm to 10 µm. Coatings 62 reduce crosstalk between adjacent subpixels Pix. The presence of coatings 62 allows to reduce the distance between adjacent wires 22.

In an embodiment, a dielectric layer, not shown, for example a silicon oxide layer may be provided between conductive layer 26 and coating 62 for each light-emitting diode LED. Intermediate dielectric layer enhances reflection of the radiations emitted by photoluminescent coatings 28R, 28G, 28B and reduces losses.

An embodiment of a method of manufacturing optoelectronic device 5 shown in FIG. 1 will be described in relation with FIGS. 8A to 8E.

Figure 8A:
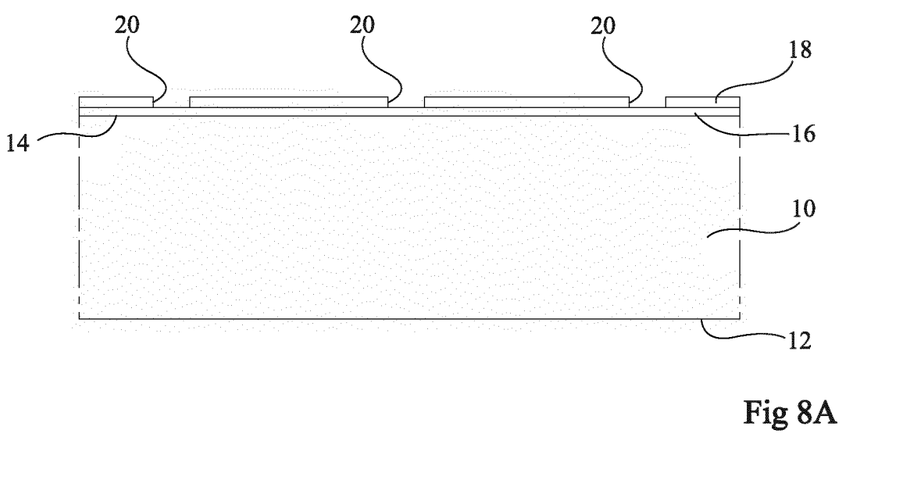
FIGS. 8A to 8E are partial simplified cross-section views of the structures obtained at successive steps of an embodiment of a method of manufacturing the optoelectronic device shown in FIG. 1.

FIG. 8A illustrates the structure obtained after having implemented the steps of:

(1) Forming seed layer 16 on surface 14 of substrate 10.

Seed layer 16 may be deposited by a method of chemical vapor deposition (CVD) or metal-organic chemical vapor deposition (MOCVD), also known as metal-organic vapor phase epitaxy (MOVPE). However, methods such as molecular beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE), or an atomic layer deposition (ALD), may be used. Further, methods such as evaporation or reactive cathode sputtering may be used.

When seed layer 16 is made of aluminum nitride, it may be substantially textured and have a preferred polarity. The texturing of layer 16 may be obtained by an additional treatment performed after the deposition of the seed layer. It for example is an anneal under an ammonia flow ($NH_3$).

(2) Depositing insulating layer 18, for example, by conformal deposition, particularly by CVD.

(3) Forming openings 20 in insulating layer 18. It may be an anisotropic etching, for example, a reactive ion etching or RIE or an inductively coupled plasma or ICP etching.

Figure 8B:
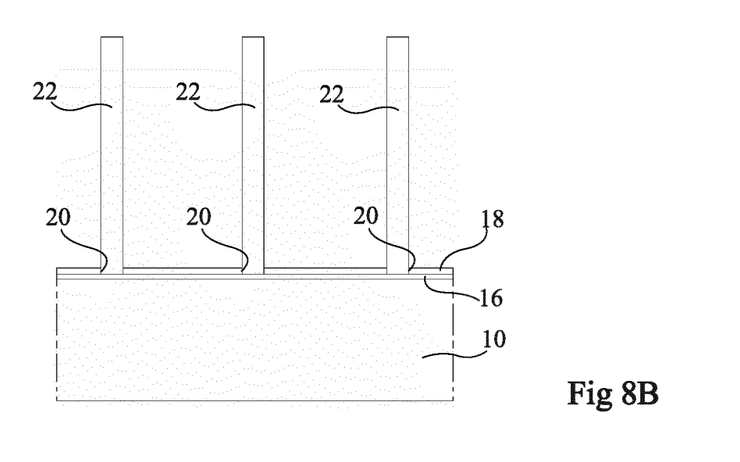

FIG. 8B illustrates the structure obtained after the step of:

(4) Growing a wire 22 in each opening 20.

The method of growing wires 22 may be a method of CVD, MOCVD, MBE, GSMBE, PAMBE, ALE, HVPE, ALD type. Further, electro-chemical methods may be used, for example, chemical bath deposition (CBD), hydrothermal methods, liquid-feed flame spray pyrolysis, or electrodeposition.

As an example, the method of growing wires 22 may comprise injecting into a reactor a precursor of a group-III element and a precursor of a group-V element.

Figure 8C:
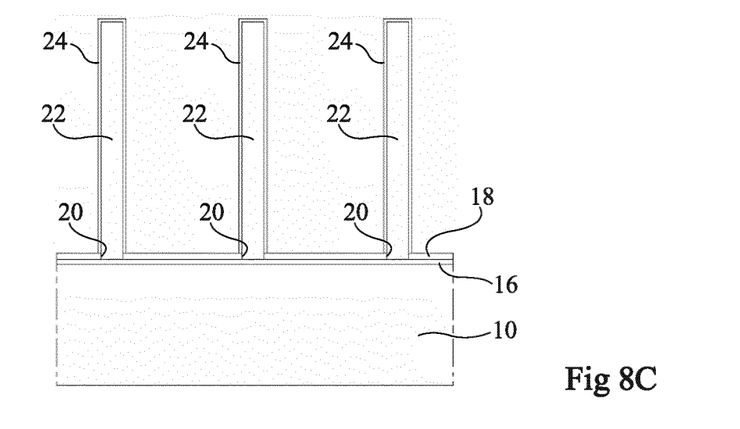

FIG. 8C illustrates the structure obtained after having implemented the steps of:

(5) Forming by epitaxy, for each wire 22, the layers which form shell 24. The deposition of the layers forming shell 24 only occurs on the portion of wire 22 outside of opening 20 and of insulating layer 18.

An example of a method for manufacturing light-emitting diode LED comprising wires covered by shells is disclosed in patent application US2015/0280053.

Figure 8D:
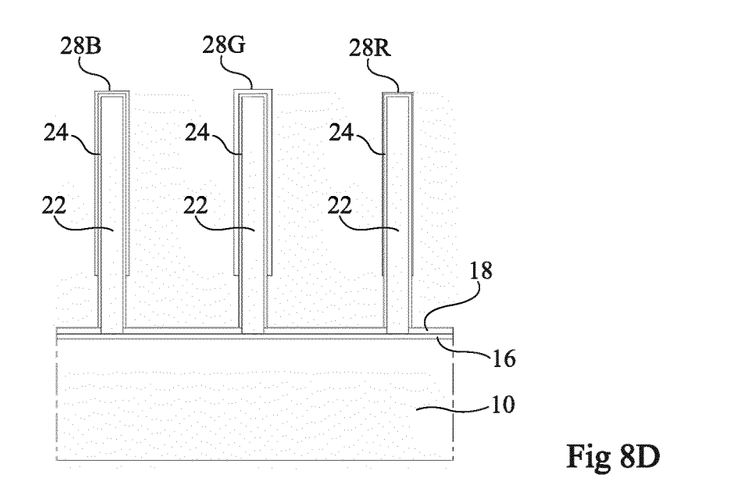

FIG. 8D illustrates the structure obtained after having implemented the steps of:

(6) Forming photoluminescent coatings 28R, 28G, 28B on an upper part of shells 24.

The method of growing photoluminescent coatings 28R, 28G, 28B may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

In an embodiment, the formation of the photoluminescent coatings 28R, 28G, 28B may comprise the deposition of a mask layer on the entire structure, the etching of the mask layer to expose the upper parts of shells 24, the formation of photoluminescent coatings 28R, 28G, 28B on the exposed parts of the layer and the withdrawal of the mask layer.

Figure 8E:
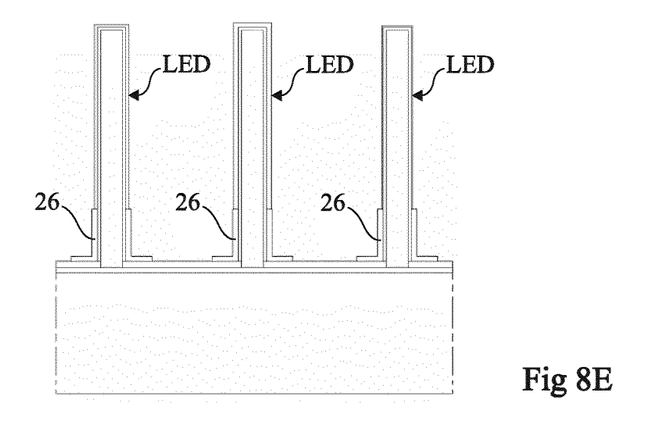

FIG. 8E illustrates the structure obtained after having implemented the steps of:

(7) Forming conductive layer 26 for each light-emitting diode LED, for example, by conformal deposition and etching of parts of the conductive layer covering photoluminescent coatings 28R, 28G, 28B. Note that the steps of FIGS. 8E and 8D can be interchanged. Therefore, the conductive layer can also be formed first, and followed by formation of the photoluminescent coatings.

In another embodiment, step (7) may be performed before step (6).

The subsequent steps of the method of manufacturing optoelectronic device 5 are the following:

(8) Forming encapsulation layer 30. When encapsulation layer 30 is made of silicone, encapsulation layer 30 may be deposited by spin coating, by jet printing, or by a silk-screening method. When encapsulation layer 30 is an oxide, it may be deposited by CVD.

(9) Forming filter 32.

An embodiment of a method of manufacturing optoelectronic device 55 shown in FIG. 6 will be described in relation with FIGS. 9A to 9D.

Figure 9A:
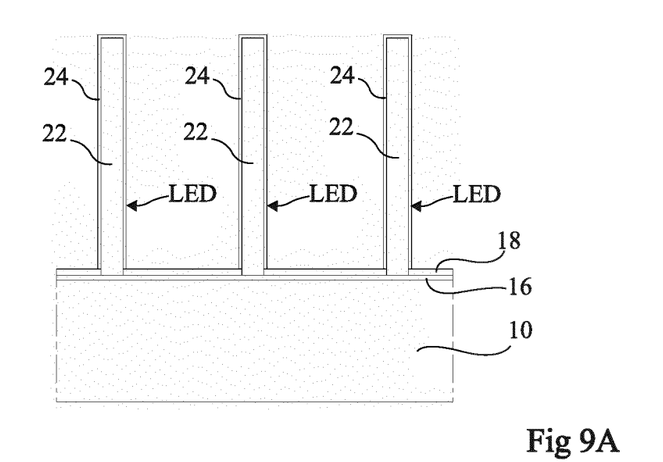
FIGS. 9A to 9D are partial simplified cross-section views of the structures obtained at successive steps of an embodiment of a method of manufacturing the optoelectronic device shown in FIG. 6.

FIG. 9A illustrates the structure obtained after having implemented the previously described steps (1), (2), (3) (4) and (5).

Figure 9B:
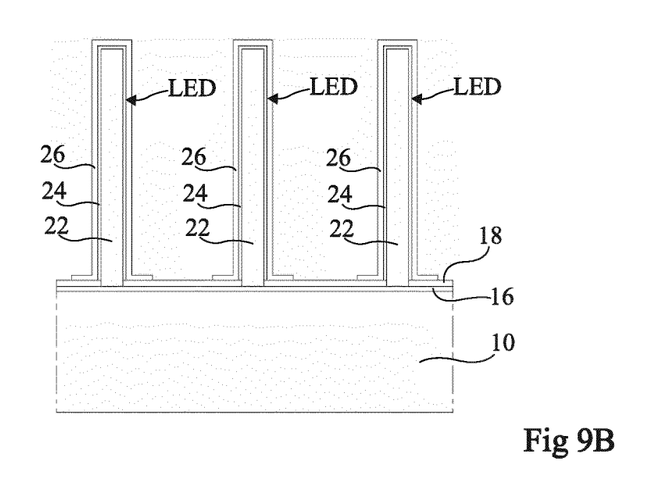

FIG. 9B illustrates the structure obtained after having implemented the steps of:

(6') Forming conductive layer 26, for each light-emitting diode LED, for example, by conformal deposition, on the totally of shell 24 and on insulating layer 18 around shell 24.

Figure 9C:
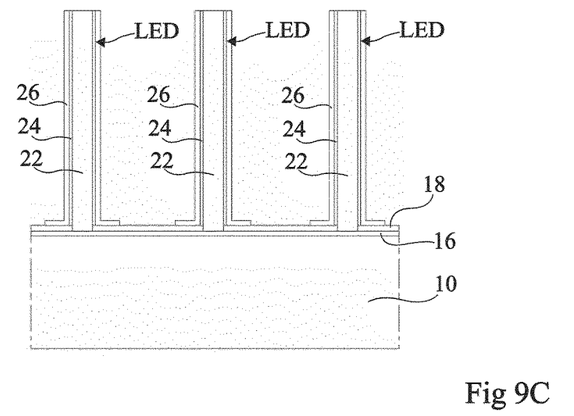

FIG. 9C illustrates the structure obtained after having implemented the steps of:

(7') withdrawing, for each light-emitting diode LED, conductive layer 26 and shell 24 on top of wire 22 to expose the upper surface of wire 22. This may be performed by ICP etching or by chemical-mechanical planarization (CMP).

Figure 9D:
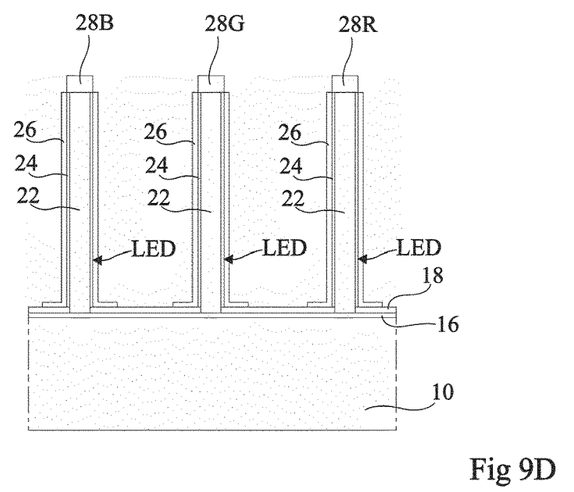

FIG. 9D illustrates the structure obtained after having implemented the steps of:

(8') Forming photoluminescent coatings 28R, 28G, 28B on top of wires 22, whereby the stacking direction is along the axis of the wire 22.

The method of growing wires coatings 28R, 28G, 28B may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

The subsequent steps of the method of manufacturing optoelectronic device 55 comprise the previously described steps (8) and (9).

Figure 10:
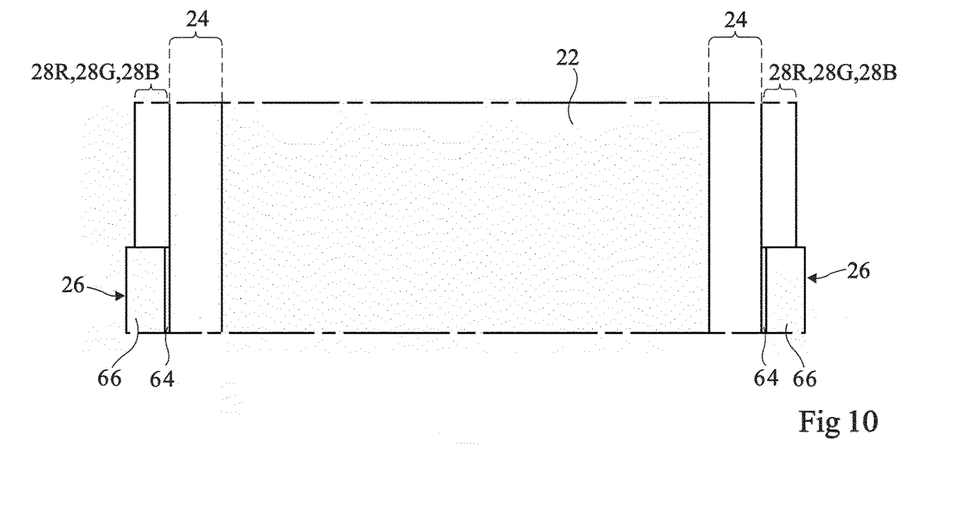
FIG. 10 is a view similar to FIG. 3 of another embodiment of the electroluminescent diode electrode layer.

FIG. 10 is a view similar to FIG. 3 of another embodiment of conductive layer 26 of the light-emitting diodes in which conductive layer 26 comprises a tunnel-junction structure comprising the stack of at least a semiconductor layer 64, very heavily doped of a first conductivity type, for example P-type, and a semiconductor layer 66 very heavily doped of a second conductivity type, opposite to the first type, for example N-type. Layer 64 is in contact with shell 24 and has the same type of dopants as the outer layer of shell 24. The dopant concentration of layer 64 may be greater than $10^{19}$ atoms/cm$^3$, preferably greater than $10^{20}$ atoms/cm$^3$. The thickness of layer 64 may be in the range from 10 nm to 100 nm. The dopant concentration of layer 66 may be greater than $10^{19}$ atoms/cm$^3$, preferably greater than $10^{20}$ atoms/cm$^3$. The thickness of layer 66 may be greater than 10 nm, for example in the range from 10 nm to 100 nm. A tunnel junction is thus obtained between layers 64 and 66. Electrical charges can flow between layer 64 and shell 24 by tunnel effect. According to one embodiment, when the outer layer of shell 24 corresponds to layer 38 previously described, layers 38 and 64 may be merged.

Specific embodiments have been described. Various alterations and modifications will occur to those skilled in the art. In particular, although in the previously-described embodiments, walls 52 have lateral faces that are substantially orthogonal to surface 14, lateral faces of walls 52 may be profiled, for example inclined with respect to surface 14.

Moreover, several embodiments with various alterations have been described. Some elements of these embodiments and alterations can be combined. As an example, optoelectronic device 55 previously described in relation to FIG. 6 may comprise walls 52 previously described in relation to FIG. 4.

The invention claimed is:

1. An optoelectronic device comprising:
   light-emitting diodes (LED), each light-emitting diode comprising a semiconductor element corresponding to a nanowire, a microwire, and/or a nanometer- or micrometer-range pyramidal structure, and a shell at least partially covering the semiconductor element and adapted to emit a radiation; and
   for each light-emitting diode, a photoluminescent coating comprising a single quantum well, multiple quantum wells or an heterostructure, covering at least part of the shell and in contact with the shell or with the semiconductor element, the photoluminescent coating being adapted to convert, by optical pumping, the radiation emitted by the shell into another radiation.

2. The optoelectronic device of claim 1, wherein the light-emitting diodes (LED) are adapted to emit a first radiation at a first wavelength and wherein the photoluminescent coatings comprise first photoluminescent coatings adapted to convert by optical pumping the first radiation into a second radiation at a second wavelength, second photoluminescent coatings adapted to convert by optical pumping the first radiation into a third radiation at a third wavelength and third photoluminescent coatings adapted to convert by optical pumping the first radiation into a fourth radiation at a fourth wavelength.

3. The optoelectronic device of claim 1, wherein each semiconductor element comprises lateral sides and a top face, and wherein the photoluminescent coatings and the shells cover the lateral sides and top faces of the semiconductor elements.

4. The optoelectronic device of claim 1, wherein each semiconductor element comprises lateral sides and a top face, wherein the shells cover the lateral sides of the semiconductor elements and do not cover the top faces of the semiconductor elements, and wherein the photoluminescent coatings cover the top faces of the semiconductor elements and do not cover the lateral sides of the semiconductor elements.

5. The optoelectronic device of claim 1, comprising, for each light-emitting diode (LED), an electrically conductive layer in contact with the shell.

6. The optoelectronic device of claim 5, wherein, for each light-emitting diode (LED), the conductive layer is covered by a reflective layer.

7. The optoelectronic device of claim 5, wherein the conductive layer comprises a tunnel junction structure.

8. The optoelectronic device of claim 2, further comprising walls resting on the substrate, at least partially made of a reflecting material at least for the second, third and fourth radiations and surrounding the light-emitting diodes (LED).

9. The optoelectronic device of claim 2, further comprising a filter covering the photoluminescent coatings and adapted to block the first radiation and to give way to the second, third and fourth radiations.

10. The optoelectronic device of claim 2, wherein the first wavelength is in the range from 360 nm to 430 nm, wherein the second wavelength is in the range from 440 nm to 490 nm, wherein the third wavelength is in the range from 510 nm to 570 nm, and wherein the fourth wavelength is in a range from 610 nm to 720 nm.

11. The optoelectronic device of claim 2, wherein the photoluminescent coatings further comprise fourth photoluminescent coatings adapted to convert by optical pumping the first radiation into a fifth radiation at a fifth wavelength.

12. The optoelectronic device of claim 11, wherein the fifth wavelength is in the range from 570 nm to 600 nm.

13. A method of manufacturing an optoelectronic device of claim 1, comprising the successive steps of:
   a) forming the light-emitting diodes (LED); and
   b) forming the photoluminescent coatings.

14. The method of claim 13, comprising, before step b), the formation of an electrically conductive layer covering the shells, and, before step b), the withdrawal of the conductive layers and the shells at the tops of the semiconductor elements, and the formation of the photoluminescent coatings at the tops of the semiconductor elements.

* * * * *